United States Patent
Galiazzo et al.

(10) Patent No.: US 8,748,319 B2
(45) Date of Patent: Jun. 10, 2014

(54) PRINTING METHOD FOR PRINTING ELECTRONIC DEVICES AND RELATIVE CONTROL APPARATUS

(75) Inventors: Marco Galiazzo, Padua (IT); Andrea Baccini, Mignagola di Carbonera (IT); Giorgio Cellere, Torri di Quartesolo (IT); Luigi De Santi, Spresiano (IT); Gianfranco Pasqualin, Spresiano (IT); Tommaso Vercesi, Treviso (IT)

(73) Assignee: Applied Materials, Inc., Santa Clara, CA (US)

( * ) Notice: Subject to any disclaimer, the term of this patent is extended or adjusted under 35 U.S.C. 154(b) by 40 days.

(21) Appl. No.: 13/394,124

(22) PCT Filed: Sep. 2, 2010

(86) PCT No.: PCT/EP2010/062861
§ 371 (c)(1),
(2), (4) Date: May 21, 2012

(87) PCT Pub. No.: WO2011/026892
PCT Pub. Date: Mar. 10, 2011

(65) Prior Publication Data
US 2012/0223046 A1 Sep. 6, 2012

(30) Foreign Application Priority Data

Sep. 3, 2009 (IT) .............................. UD2009A0147
Sep. 3, 2009 (IT) .............................. UD2009A0154

(51) Int. Cl.
*H01L 21/311* (2006.01)

(52) U.S. Cl.
USPC ................ 438/694; 216/11; 216/39; 216/83; 438/98; 438/686; 438/687; 438/688; 438/689

(58) Field of Classification Search
CPC ... C23F 1/02; H01L 21/30604; H05K 1/0266; H05K 2203/16; H05K 2203/166; H05K 3/1241
See application file for complete search history.

(56) References Cited

U.S. PATENT DOCUMENTS

| | | | |
|---|---|---|---|
| 2002/0083570 A1 | 7/2002 | Inoue et al. | |
| 2005/0122351 A1* | 6/2005 | Yamazaki et al. | 347/5 |
| 2005/0194037 A1* | 9/2005 | Asai | 136/256 |
| 2007/0209697 A1 | 9/2007 | Karakida et al. | |
| 2008/0083816 A1 | 4/2008 | Leinbach et al. | |
| 2009/0142880 A1* | 6/2009 | Weidman et al. | 438/98 |

OTHER PUBLICATIONS

International Search Report and Written Opinion dated Feb. 8, 2011 for International Patent Application PCT/EP2010/062861.

* cited by examiner

*Primary Examiner* — Lan Vinh
*Assistant Examiner* — Jiong-Ping Lu
(74) *Attorney, Agent, or Firm* — Patterson & Sheridan, LLP

(57) ABSTRACT

Embodiments of the invention may provide a method of printing one or more print tracks on a print support, or substrate, comprising two or more printing steps in each of which a layer of material is deposited on the print support according to a predetermined print profile. In each printing step, subsequent to the first step, each layer of material is deposited at least partially on top of the layer of material printed in the preceding printing step, so that each layer of printed material has an identical or different print profile with respect to at least a layer of material underneath. The method may further comprise depositing material in each printing step that is equivalent to or different from the material deposited in at least one of other the print layers.

14 Claims, 11 Drawing Sheets

PRINTING METHOD FOR PRINTING ELECTRONIC DEVICES AND RELATIVE CONTROL APPARATUS

CROSS-REFERENCE TO RELATED APPLICATIONS

This application claims benefit of International Patent Application Serial No. PCT/EP2010/062861 filed Sep. 2, 2010, which claims the benefit of Italian Patent Application Serial Number UD2009A000147, filed Sep. 3, 2009 and Italian Patent Application Serial Number UD2009A000154, filed Sep. 3, 2009, which are all herein incorporated by reference.

BACKGROUND OF THE INVENTION

1. Field of the Invention

The present invention concerns a printing method for printing electronic devices, depositing one or more print tracks on a substrate, and the relative control apparatus.

Embodiments of the present invention concerns a control method based on an expert system for depositing one or more print tracks on a substrate, or a print support, for example may be used in steps for silk-screen printing, ink jet printing, laser or other, for example for printing conductive tracks on a wafer, a substrate or thin sheet, or a silicon plate, in order to processing line and make photovoltaic cells, and the relative control apparatus.

In particular, the method is used in a plant for producing single or multiple layer patterns by means of silk-screen printing, ink jet printing, laser or other type of printing or defining physical patterns on print supports.

2. Description of the Related Art

SUMMARY OF THE INVENTION

Solar cells are photovoltaic devices which convert solar light directly into electric energy. Solar cells are commonly made on silicon substrates, which can be substrates of mono- or multi-crystalline or amorphous silicon. A solar cell of the known type comprises a silicon substrate or wafer, of a thickness less than about 0.3 mm, having a thin layer of silicon on the top of another zone formed on the substrate.

Printing methods, for example multi-layer, for solar cells in the state of the art use silk-screen printing, ink-jet printing or other workings of the known type to deposit, for example in succession, layers of the same material, or of different materials, metal or insulating, according to a predetermined print mask, so as to make a desired electric pattern, provided with thin conductive lines, with collector and/or distribution lines, and/or with insulating tracks on said substrates.

The known methods, again in the case of multi-layer printing, provide to align with high precision the mask, or the print net, of the printing station or stations between one print and the next, so as to deposit on the substrate two or more layers of equal conformation and perfectly on top of each other in order to reach a predetermined height.

One disadvantage of these known printing methods is that, to guarantee, for example, a predetermined electric conductivity of the conductive lines, it is not always possible to obtain an optimal contact surface between the electrically conductive material of each conductive line and the semiconductor material of the substrate.

Moreover, since each conductive line is provided with a substantially square or rectangular cross section, obtained as the sum of identical overlapping rectangular sections and relating to each layer, its overall conductivity depends both on the height, that is the total number of layers, and on their width.

This makes it necessary to avoid making conductive lines which are too narrow, but this determines a decrease in the efficiency of the solar cells made, due substantially to the shadow zone projected by each same line onto the substrate.

Further, in such methods an accurate control of the operating conditions of the printing steps is essential, and also of every other accessory working step and of the result obtained in every individual operating passage.

To obtain a precise control of the operating conditions a series of adjustable machine parameters are used.

Solutions and methods are known which provide control steps in which, by means of suitable detection devices, a plurality of parameters are acquired before and after printing one layer of the pattern on the print support, or during another working step connected to the production of the print supports themselves, so as to detect any possible errors.

If errors are detected outside a desired or necessary tolerance, the settings of the alignment means, the printing heads or other equipment are modified, so as to effect an adequate correction in feedback for working subsequent print supports.

One disadvantage of such control methods is that the alignment means, the printing heads and any other equipment must be adjusted on each occasion at the start of every cycle, for example in the passage between different batches of print supports.

Furthermore, when during the process a lack of uniformity is detected in the print supports made, or inconsistencies in the functioning parameters of the machine, it becomes necessary to re-set all the operating parameters.

These disadvantages lead to prolonged periods of stoppage of the machine and entail the use of expert operators, and therefore cause inefficient productivity with a consequent increase in the production costs of the print supports thus made.

Purpose of the present invention is to achieve a printing method which allows to perfect the printing process on the print supports, or substrates, and to increase the efficiency and energy performance of the solar cells thus made.

An other purpose of the present invention is to perfect a control method and achieve a control apparatus for printing a pattern on a print support which allows to reduce the downtimes of the machine and/or the times connected to setting the operating parameters.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

In accordance with said purpose, a printing method for deposit one or more print tracks, according to a determinate print pattern, on a print support, by means of printing means, comprises two or more printing steps in each of which, by printing means, for example silk-screen printing means, laser or ink-jet, or others, a layer of material is deposited on a print support according to a predetermined print profile.

According to the present invention, the method comprising at least a work cycle in which, in each printing step, subsequent to the first, each layer of material is deposited at least partially on top of the layer of material printed in the preceding printing step. Each layer of printed material has a predetermined print profile with respect to at least one layer of material underneath, so as to make a contact area with respect to at least an area printed previously. Moreover the material deposited in each printing step can be the same material, or different from the material printed in a preceding printing step.

Here and hereafter, by print or lower layer, reference is made indifferently to a print or layer that is either immediately underneath but in any case preceding even if not immediately underneath.

In this way it is possible to make, for example, multi-layer conductive lines in which the first layer, the one in contact with the print support, that is the substrate, is made with a material comprising a vitreous mixture, so as to allow, during a high-temperature heat treatment, the metal-based paste to penetrate into the insulating layer and therefore to allow the paste to contact the substrate, thus obtaining the contact resistance desired. The subsequent layers are made, for example, with materials which are purely conductive or insulating.

The vitreous mixture can be any one of those easily found on the market.

In one embodiment, the temperature at which the heat treatment is carried out is advantageously comprised between 500° C. and 900° C., preferably about 700° C.

Moreover, since these subsequent layers can be printed according to different print profiles even with respect to the first, for example with a greater transverse size, they allow a substantial decrease in the shadow zones projected by the lines on the substrate and, therefore, an increase in the conversion efficiency of the solar cells produced.

The method in accordance with the present invention provides alignment steps, each provided upstream of a corresponding printing step, in which, by means of alignment means, the print support and the printing means are reciprocally aligned to print the corresponding layer in the desired position.

According to the present invention, the method comprises detection steps, coordinated with the alignment steps in which, by means of detection means, information is acquired relating to the print supports being worked and to the relative printing steps.

The data detected in the detection step are used to command the alignment means in the alignment step. In this way, it is possible to correct the reciprocal alignment between the printing means and the substrate being worked, so as both to compensate the errors or discrepancies detected, to calibrate the functioning parameters of the printing means, and to correct the discrepancies between the desired working and the one obtained.

Other data acquirable can relate to environmental and/or operating parameters.

According to a variant of the present invention, the method comprises at least a printing step in which an incision material is delivered, able to etch at least part of the print support and/or of a covering layer thereof and/or of a layer of material already printed, in order to define a deposit seating which guarantees an improved bond between a printed layer of material to the substrate.

According to another variant of the present invention, after the printing step of the incision material the method provides a step to clean the print support and/or the deposit seating, in order to eliminate any residual impurities before the printing of the subsequent layer of material.

It also comes within the spirit of the present invention to provide that, between the printing step or steps, or at its/their end, further working steps of the print supports are carried out, such as gaseous state diffusion steps, chemical attack steps, control and supervision of the working, testing steps or others, irrespective of their sequence.

According to a variant of the present invention, the work cycle comprises at least a memorization step in which, by means of memorization means, the data acquired in the detection step are memorized in a data base. Moreover, the method comprises at least a comparison step in which, by means of processing means, the data memorized in the database are compared with the data memorized in a memorization step of at least a previous work cycle. This is so as to effect possible corrective actions in each corresponding alignment step and/or printing step. The corrective actions comprise for example the correction of the positioning of the print supports and/or in the printing of the layer or layers of material.

It is in the spirit of a variant of the invention to provide that the corrective actions or compensation are carried out in feedback, acting on the print supports currently being worked.

According to another variant of the invention the corrective actions or compensation are carried out in feedforward, acting on the print supports which will be worked afterward.

According to another variant the data comprise the positioning of the print support before and after the printing of a layer of material.

According to another variant, the data also comprise the alignment and/or position of the printed layer with respect to one or more possible previous layers and/or with respect to predetermined reference positions.

Another variant provides that the data comprise the alignment of the print support with respect to a corresponding printing plane.

Another variant provides that the data comprise possible mechanical and/or heat deviations or drifts relating to the position of the printing means and/or of all the components involved in the printing steps.

The data comprise, according to another variant, operating parameters detected during the printing steps.

According to a variant of the present invention the operating parameters comprise at least the temperature of at least some of the components involved in the printing steps.

According to another variant, the operating parameters comprise the working pressure, both mechanical and pneumatic, of at least some of the components involved in the printing steps.

According to another variant of the present invention the data also comprise the number of operating cycles to which the printing means and/or some of their parts have been subjected, including the consumable components, such as for example the print nets.

In this way, by acquiring one or more of the data, by memorizing them and comparing them with the previously acquired data, it is possible to define a case record that allows an increasingly accurate and optimized analysis of the working of the print supports. Indeed, the processing and comparison allows to access the data memorized and to set, on each occasion and dynamically, the parameters to correct the operating conditions of the printing means and of all the components involved.

The steps of the method are carried out with each cycle, thus obtaining a printing accuracy that improves from print to print, also for printing multi-layer patterns, and which compensates, without any intervention from the operator, any deviations due for example to the deterioration of one or more of the components that make up the printing means, or heat dilations of the print support or of the printing plane of the print support.

This also allows to automatically align the printing means, right from the first printing, with the print support, and prevents or at least minimizes possible manual operations of initial set-up. Therefore, at the start of a new work cycle or following the transition between different production batches, it is possible to avoid unwanted and prolonged downtimes of the machine, increasing productivity and reducing the final cost of the print supports.

According to a variant of the present invention, the data are acquired by means of detection means, able to determine the reciprocal position of the printing means and the print supports before printing and/or the position of the layers deposited with respect to a desired print pattern after printing.

According to another variant, the data are acquired by means of detection means that detect the temperature and/or humidity of the environment and/or of the print supports when they are being worked.

According to another variant, the data are acquired by means of detection means that detect the pressure or force or position associated with the printing means and/or with components involved in the printing steps.

It comes within the spirit of the present invention that the detection means comprise detectors that detect the type or batch of the print supports.

BRIEF DESCRIPTION OF THE DRAWINGS

These and other characteristics of the present invention will become apparent from the following description of a preferential form of embodiment, given as a non-restrictive example with reference to the attached drawings wherein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Detailed Description of a Preferential Form of Embodiment

With reference to the attached drawings, a method according to the present invention is a multi-layer printing method usable to print a pattern, for example a silk-screen printing with multiple layers on a print support or a substrate 150 or a wafer, made of a silicon or other semi-conductor material, preferably for making in a method to make solar cells.

The attached drawings show schematically one embodiment of a control apparatus 80 able to carry out the method shown and a substrate processing system, or system 100, associated with one embodiment of the present invention.

The apparatus 80 can be inserted in a production line for solar cells, in particular for making multi-layer patterns by means of silk-screen printing on substrates 150.

Figure 1A:
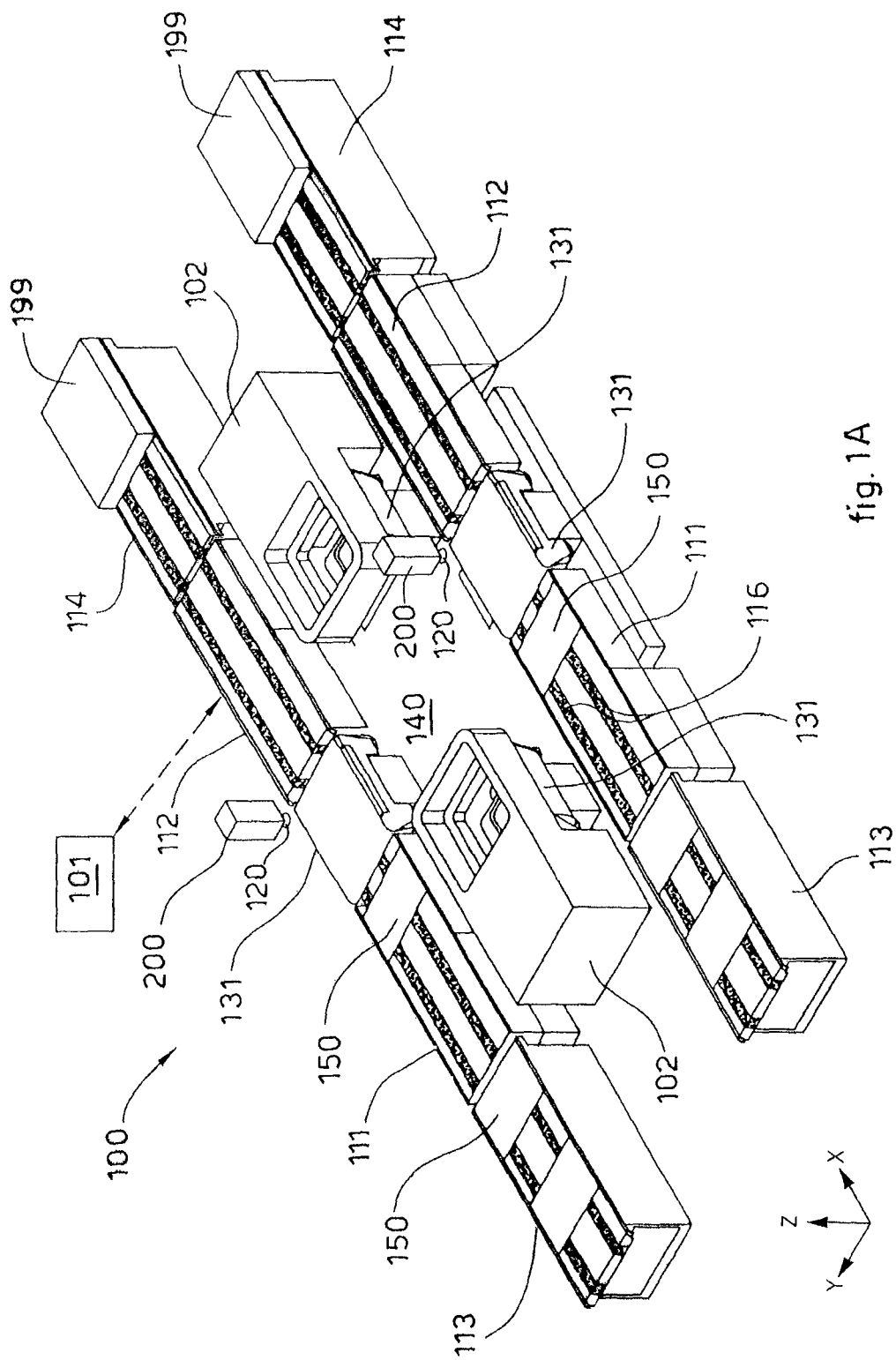
FIG. 1A is a schematic isometric view of a processing system associated with one embodiment of the present invention.

FIG. 1A is a schematic isometric view of the system 100, associated with an embodiment of the present invention.

In this case, reference will be made hereafter to the embodiment of conductive lines 11 used to collect, in a capillary way, the current generated due to the photovoltaic effect by the solar cell on all its surface and to channel it toward the conductive collector or distribution lines.

The conductive lines 11 may contain a metal, such as aluminum (Al), silver (Ag), tin (Sn), cobalt (Co), rhenium (Rh), nickel (Ni), zinc (Zn), lead (Pb), palladium (Pd), molybdenum (Mo), titanium (Ti), tantalum (Ta), vanadium (V), tungsten (W), or chrome (Cr). In one example, the conductive lines 11 are, at least partially, realized with a metal paste that contains silver (Ag) or tin (Sn).

It is understood that the method according to the present invention can also be used to make other conductive or insulating structures.

Figure 2:
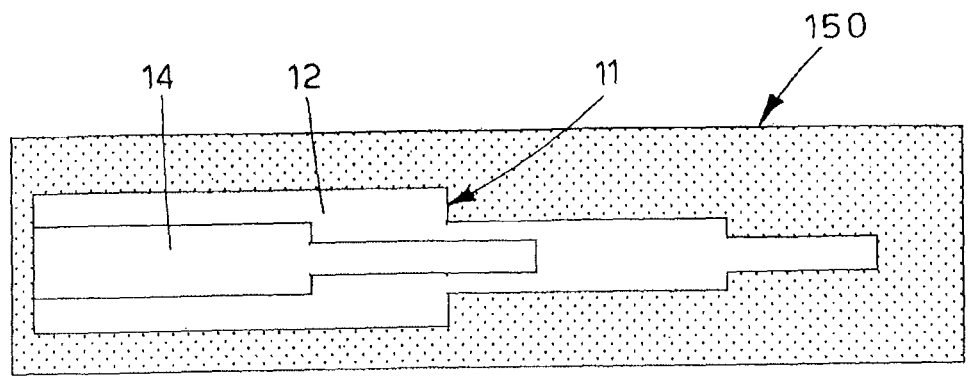
FIG. 2 is a schematic view from above of two layers of material deposited during the multi-layer printing method according to the present invention.
Figure 3:
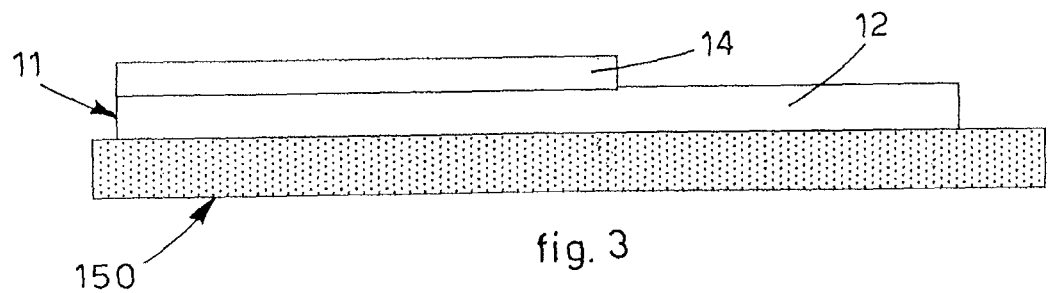
FIG. 3 is a lateral view of FIG. 2.
Figure 4A:
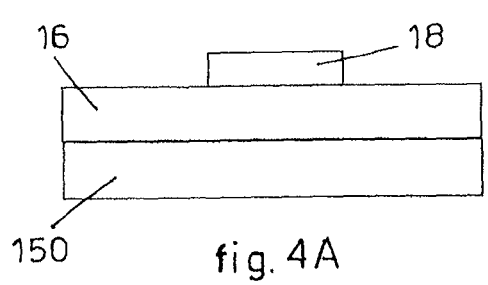
FIGS. 4A-4D are schematic views of working steps of the method according to the present invention.
Figure 4B:
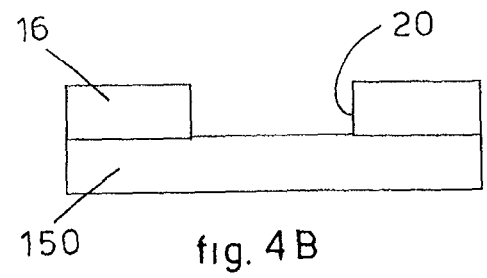
Figure 4C:
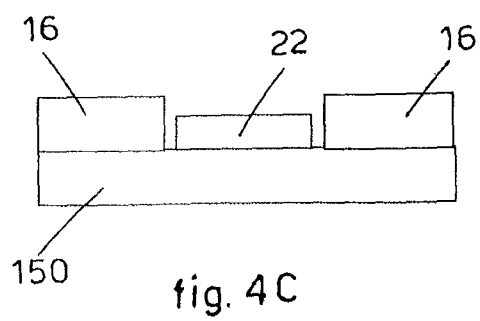
Figure 4D:
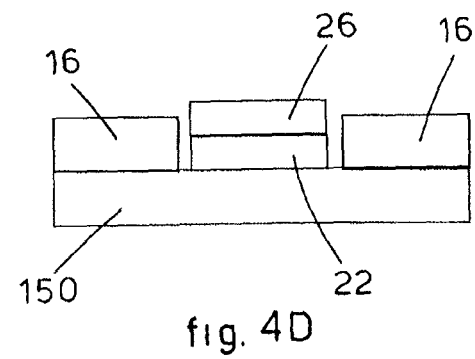
Figure 4E:
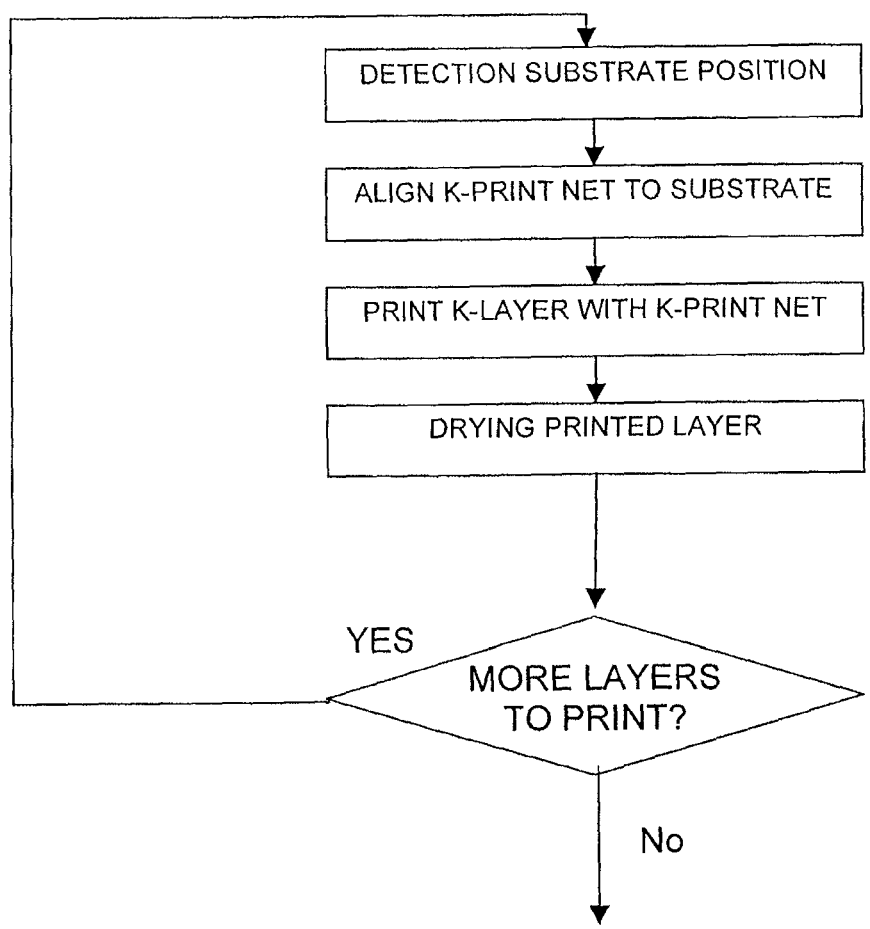
FIG. 4E is a schematic diagram of an operational sequence according to embodiments of the present invention.
Figure 5A:
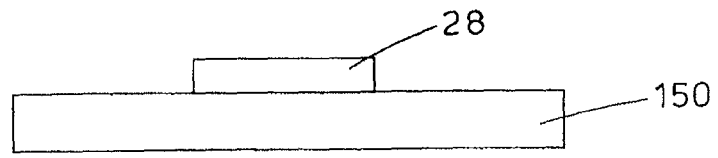
FIGS. 5A-5D are schematic views of working steps in a different operating sequence of the method according to the present invention.
Figure 5B:
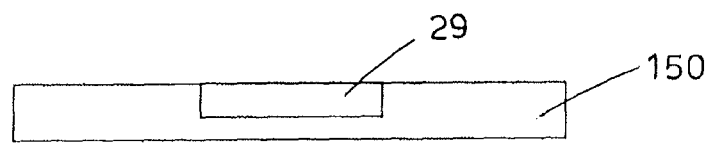
Figure 5C:
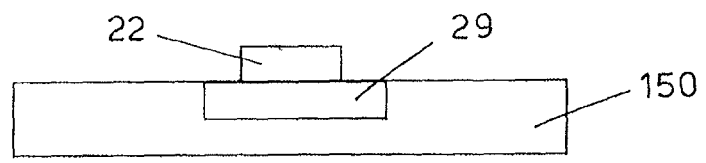
Figure 5D:
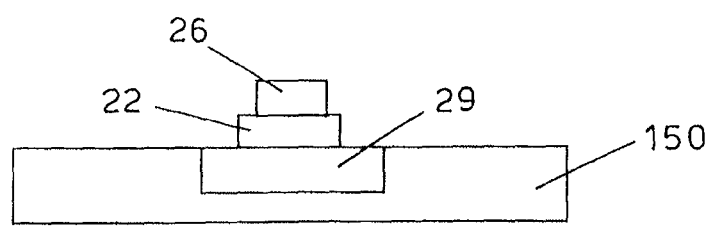

With reference to FIGS. 2 and 3, in which a portion of conductive line 11 is shown deposited on a substrate 150, the method comprises at least two printing steps in each of which, by means of a printing station, as described hereinafter, an equal number of layers of conductive material, or conductive lines 11, are made according to a predetermined print profile. The printing steps may include screen printing processes, ink jet printing processes, lithographic or blanket metal deposition processes, or other similar patterned metallization processes.

Figure 1B:
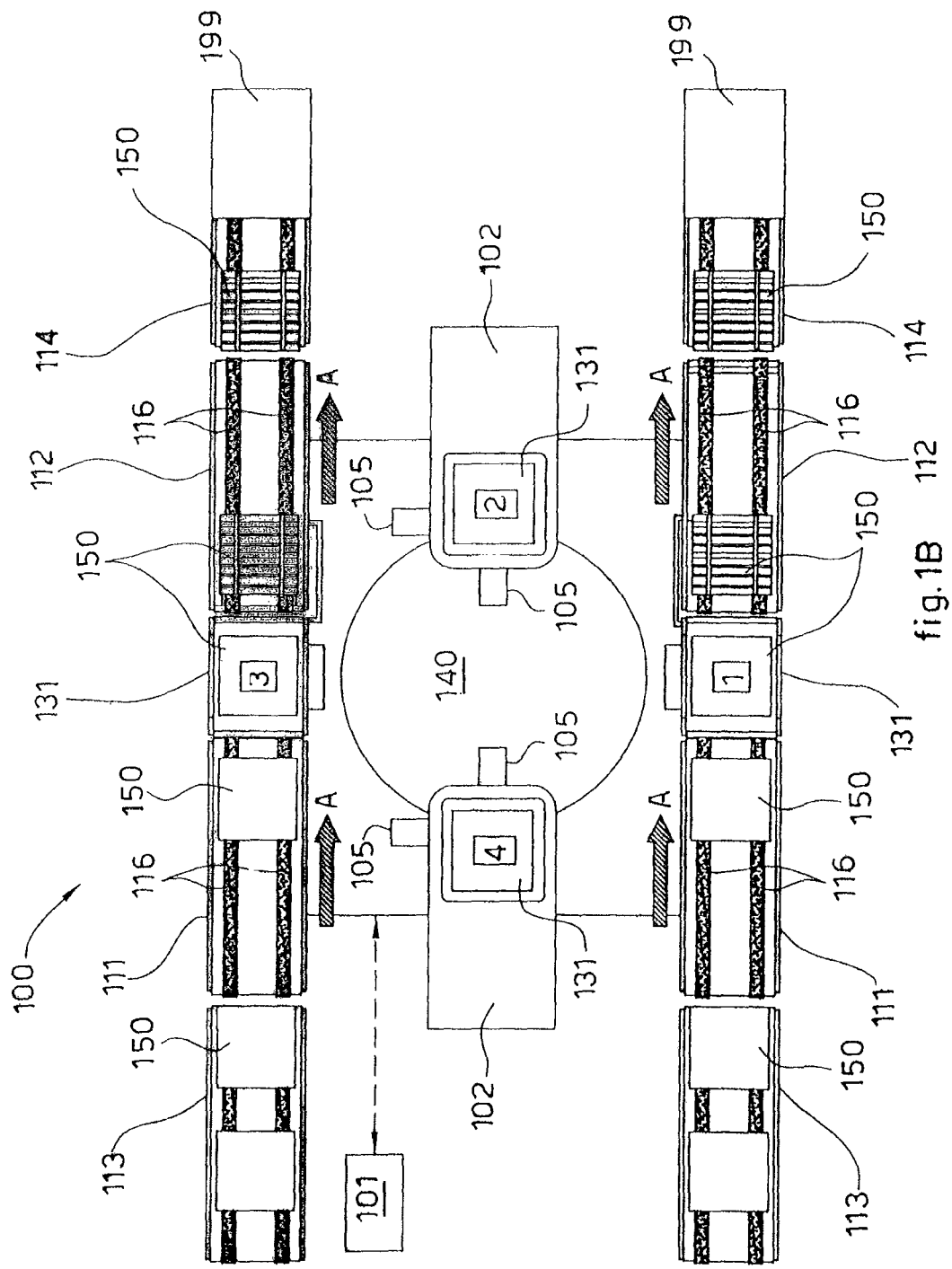
FIG. 1B is a schematic plan view of the system depicted in FIG. 1A.

FIG. 1B is a schematic top plan view illustrating one embodiment of a printing system, or system 100, that may be used in conjunction with embodiments of the present invention to print a pattern, for example with multiple layers, on a surface of a solar cell substrate 150.

In one embodiment, the system 100 generally includes two incoming conveyors 111, an actuator assembly 140, a plurality of processing nests 131, a plurality of processing heads 102, two outgoing conveyors 112, and a system controller 101. The incoming conveyors 111 are configured in a parallel processing configuration so that each can receive unprocessed substrates 150 from an input device, such as an input conveyor 113, and transfer each unprocessed substrate 150 to a processing nest 131 coupled to the actuator assembly 140. Additionally, the outgoing conveyors 112 are configured in parallel so that each can receive a processed substrate 150 from a processing nest 131 and transfer each processed substrate 150 to a substrate removal device, such as an exit conveyor 114.

In one embodiment, each exit conveyor 114 is adapted to transport processed substrates 150 through an oven 199 to cure material deposited on the substrate 150 via the processing heads 102.

In one embodiment of the present invention, the system 100 is a screen printing processing system and the processing heads 102 include screen printing components, which are configured to screen print a patterned layer of material on a substrate 150.

In another embodiment, the system 100 is an ink jet printing system and the processing heads 102 include ink jet printing components, which are configured to deposit a patterned layer of material on a substrate 150. In yet another embodiment, the system 100 is a processing system that includes material removal components in the processing head 102, such as a laser for ablating or etching one or more regions of a substrate 150. In other embodiments, the system 100 may comprise other substrate processing modules requiring precise movement and positioning of the substrates for processing.

FIGS. 1A and 1B illustrate the system 100 having two processing nests 131 (in positions "1" and "3") each positioned to both transfer a processed substrate 150 to the outgoing conveyor 112 and receive an unprocessed substrate 150 from the incoming conveyor 111.

Thus, in the system 100, the substrate motion generally follows the path "A" shown in FIGS. 1A and 1B. In this configuration, the other two processing nests 131 (in positions "2" and "4") are each positioned under a processing head 102 so that a process (e.g., screen printing, ink jet printing, material removal) can be performed on the unprocessed substrates 150 situated on the respective processing nests 131.

Such a parallel processing configuration allows increased processing capacity with a minimized processing system footprint. Although the system 100 is depicted having two processing heads 102 and four processing nests 131, the system 100 may comprise additional processing heads 102 and/or processing nests 131 without departing from the scope of the present invention.

In one embodiment, the incoming conveyor 111 and outgoing conveyor 112 include at least one belt 116 to support and transport the substrates 150 to a desired position within the system 100 by use of an actuator (not shown) that is in communication with the system controller 101. While FIGS. 1A and 1B generally illustrate a two belt style substrate transferring system, other types of transferring mechanisms may be used to perform the same substrate transferring and positioning functions without varying from the basic scope of the invention.

In one embodiment, the system 100 also includes an inspection system 200, which is adapted to locate and inspect the substrates 150 before and after processing has been performed. The inspection system 200 may include one or more detection means, or cameras 120, that are positioned to inspect a substrate 150 positioned in the loading/unloading positions "1" and "3," as shown in FIGS. 1A and 1B.

The inspection system 200 generally includes at least one camera 120 (e.g., CCD camera) and other electronic components that are able to locate, inspect, and communicate the results to the system controller 101. In one embodiment, the inspection system 200 locates the position of certain features of an incoming substrate 150 and communicates the inspection results to the system controller 101 for analysis of the orientation and position of the substrate 150 to assist in the precise positioning of the substrate 150 under a processing head 102 prior to processing the substrate 150.

In one embodiment, the inspection system 200 inspects the substrates 150 so that damaged or mis-processed substrates can be removed from the production line. In one embodiment, the processing nests 131 may each contain a lamp, or other similar optical radiation device, to illuminate the substrate 150 positioned thereon so that it can be more easily inspected by the inspection system 200.

The system controller 101 facilitates the control and automation of the overall system 100 and may include a central processing unit (CPU), or processing sub-unit 25, (FIG. 10), memory 128, and support circuits (or I/O) (not shown). The CPU, or processing sub-unit 25, may be one of any form of computer processors that are used in industrial settings for controlling various chamber processes and hardware (e.g., conveyors, detectors, motors, fluid delivery hardware, etc.) and monitor the system and chamber processes (e.g., substrate position, process time, detector signal, etc.). The memory 128 is connected to the CPU, or processing sub-unit 25, and may be one or more of a readily available memory, such as random access memory (RAM), read only memory (ROM), floppy disk, hard disk, or any other form of digital storage, local or remote.

Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101, which includes code to generate and store at least substrate positional information, the sequence of movement of the various controlled components, substrate inspection system information, and any combination thereof, as will be described in the following.

In one embodiment, the two processing heads 102 utilized in the system 100 may be conventional screen printing heads available from Applied Materials Italia Srl which are adapted to deposit material in a desired pattern on the surface of a substrate 150 disposed on a processing nest 131 in position "2" or "4" during a screen printing process. In one embodiment, the processing head 102 includes a plurality of actuators, for example, actuators 105 (e.g., stepper motors or servomotors) that are in communication with the system controller 101 and are used to adjust the position and/or angular orientation of a screen printing mask (not shown) disposed within the processing head 102 with respect to the substrate 150 being printed.

In one embodiment, the screen printing mask is a metal sheet or plate with a plurality of holes, slots, or other apertures formed therethrough to define a pattern and placement of screen printed material on a surface of a substrate 150. In one embodiment, the screen printed material may comprise a conductive ink or paste, a dielectric ink or paste, a dopant gel, an etch gel, one or more mask materials, or other conductive or dielectric materials.

In general, the screen printed pattern layers that are to be deposited on the surface of a substrate 150 are aligned to the substrate 150 in an automated fashion by orienting the screen printing mask using the actuators 105 and information received by the system controller 101 from the inspection system 200. In one embodiment, the processing heads 102 are adapted to deposit a metal containing or dielectric containing material on a solar cell substrate having a width between about 125 mm and 156 mm and a length between about 70 mm and 156 mm.

In particular, in a first printing step, by using a first print net, or screen printing mask, of the silk-screen printing station, a first layer 12 is deposited of a first metal material so as to optimize, for example, the contact of the first layer 12 and therefore of the line 11 with the substrate 150 of semi-conductor material. The first layer 12 is deposited according to a predetermined print profile.

The first metal material can, for example, comprise a vitrifiable mixture so as to penetrate the insulating layer and make a good electric contact with the substrate 150.

The materials for the vitrifiable mixture, and also those for the insulating layer, are not limited and can be any material easily available on the market.

The first print net is conformed to make at least a part of the overall pattern which is to be printed, and has a print mask such as to define the sizes of the portions of pattern made with the first layer 12.

In a second printing step, by using a second print net of the silk-screen printing station, a second layer 14 is deposited by delivering a second metal material. The second layer 14 is deposited at least partially on top of the first layer 12 as shown in FIGS. 2 and 3.

In this case, the second print net is suitable to deposit the second layer 14 according to a second print profile, substantially similar to the first profile, but having a smaller area and corresponding to the contact surface of said layer 12.

The second print net, or screen printing mask, has a plurality of features, such as holes, slots or other apertures having smaller width than the one of the first print net so as to define, after printing said second layer 14, said smaller area of the contact surface. Width values of the first print net may be in the range between about 80 μm and about 120 μm, while typical width values of the second print net are between about 20 μm and about 40 μm, smaller than the first print net.

The second metal material can, for example, be without said vitrifiable mixture, being composed only by purely conductive materials, so as to optimize the electric resistance of electric contact between the layers 12, 14 and the conductivity of the conductive lines 11.

The printing method can also provide further printing steps subsequent to the second in order to make, for example by means of the second net, other metal layers deposited exactly on top of the second layer 14, until a predetermined overall thickness is reached such as to make a conductive line 11 according to desired electric parameters.

Alignment steps are provided upstream of a corresponding printing step, in which, by means of the actuators 105, the screen printing mask is aligned with respect to the substrate 150 so as to print the corresponding layers in the desired position.

The printing method can also provide detection steps, coordinated with the alignment steps in which, by means of the inspection system 200, information is acquired relating to the substrates 150 being worked and to the relative printing steps.

It is understood that the printing steps can be made in an equal number of printing heads 102 and that between the printing steps further working steps can be provided, such as for example other drying steps of the layers deposited in a drying oven, or other suitable device.

The drying steps may be performed in a drying oven adjacent to the printing heads 102 of the system 100, for example in position "4", or in the oven 199. An example of oven that may be used is further described in the Applicant's U.S. patent application Ser. No. 12/274,023, filed Oct. 24, 2008, which is herein incorporated by reference in its entirety.

In FIGS. 4A to 4E an operating sequence is shown of some working steps of the method according to the present invention.

In a first printing step (FIGS. 4A, 4E) on a substrate 150 of semi-conductor material provided with an insulating lining or layer 16, such as an oxide layer, a layer of incision paste 18 is deposited according to a predetermined and desired print profile.

The profile is determined so as to form, for example, a patterned selective emitter structure in a crystalline solar cell.

An example of incision paste comprising an etching gel that can be used to form one or more patterned layers is further discussed in the commonly assigned U.S. patent application Ser. No. 12/274,023.

In a subsequent step (FIG. 4B, 4E), the incision paste, left to act for a desired time, effects an action of removing/eroding a corresponding portion of insulating layer 16, so as to define a printing seating 20 conformed according to the print of the incision paste 18. The material removal process may be performed using an etching paste which reacts with the insulating layer 16 to form a volatile etch product.

It is understood that after the incision step a cleaning step can be carried out, in a known way, for example by means of known dry or wet cleaning processes, so as to remove possible impurities, or residues, of material from the printing seating 20.

In one embodiment the clean process may be performed by wetting surfaces of the substrate 150 with a cleaning solution. In one embodiment, the clean process may be performed by wetting the substrate with a cleaning solution, such as an SC1 cleaning solution, an SC2 cleaning solution, HF-last type cleaning solution, ozonated water solution, hydrofluoric acid (HF) and hydrogen peroxide ($H_2O_2$) solution, or other suitable and cost effective cleaning process.

In a second printing step (FIGS. 4C, 4E) a first metal paste 22 is deposited according to the same print profile as in the preceding printing step, so as to deposit the paste 22 in the seating 20. In this way it is possible to obtain a better grip of the first paste 22 to the substrate 150. The first metal paste 22 can, for example, comprise a vitrifiable mixture, as above described.

It is also possible, given the same height of the print profile or profiles, to obtain a lower height with respect to that of the finished substrate, so as to define a protection seating for the conductive lines 11.

In a third printing step (FIGS. 4D, 4E) a second metal paste 26 is deposited exactly above the first metal paste 22, again according to the same print profile. In this case too the second metal paste 26 can possibly be without any vitrifiable mixtures, in this case optimizing the conductive properties of the layer thus made and of the possible further layers deposited above. The second metal paste 26 may contain only conductive materials, such as silver (Ag) or tin (Sn).

In FIGS. 5A to 5D an operating sequence is shown of some working steps of a different form of embodiment of the method according to the present invention.

In a first printing step (FIG. 5A) on a substrate 150 of semi-conductor material a doping paste 28, such as a phosphorus containing paste or the like, or a doping ink is deposited, by means of a first print net according to a predetermined and desired print profile.

The doping paste 28 is chosen from among those easily available on the market, while its concentration is chosen according to the individual cases, which comes within the normal knowledge of a person of skill.

In a subsequent step (FIG. 5B), the doping paste 28 diffuses into the substrate 150 so as to define a doped portion 29, substantially according to the print profile made in depositing the doping paste 28 and so as to have a desired thickness. This diffusion step is made, for example, by means of a heat annealing process or other known process of diffusion of doping materials in substrates of semi-conductor material.

The values of time and temperature of the diffusion step are coordinated with each other and are chosen on each occasion according to the intrinsic characteristics of the materials, which comes within the normal knowledge of a person of skill.

In a second printing step (FIG. 5C) a first metal paste 22 is deposited, using a second print net having a print profile narrower in width with respect to that of the doping paste 28, so as to deposit the first metal paste 22 on top of the doped portion 29 substantially centrally.

In one embodiment, the width of the profiles is comprised between 50 µm and 110 µm.

In a third printing step (FIG. 5D) a second metal paste 26 is deposited above the first metal paste 22, using a third print net having a print profile narrower in width with respect to that of the paste 22, so as to deposit the second paste 26 on top of the paste 22 substantially centrally. In this case too the second paste 26 is chosen so as to optimize the contact with the first paste 22 underneath.

Figure 6:
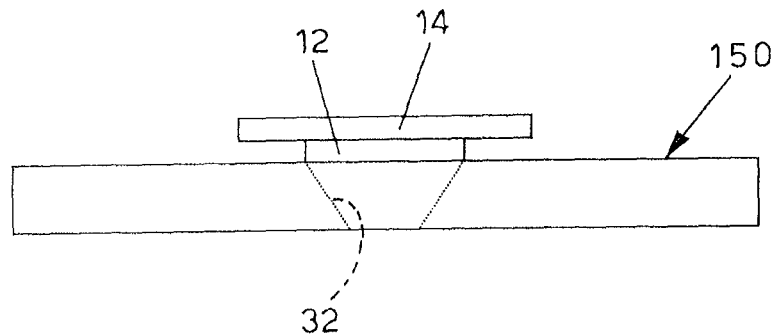
FIG. 6 is a schematic lateral view of two layers of material deposited according to the multi-layer printing method.
Figure 7:
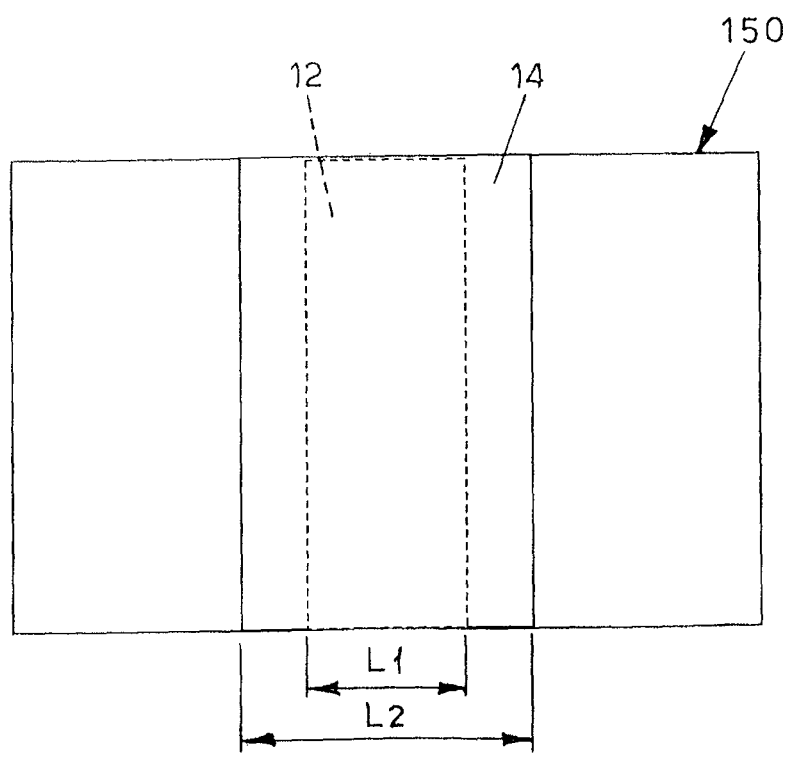
FIG. 7 is a schematic view from above of FIG. 6.
Figure 8A:
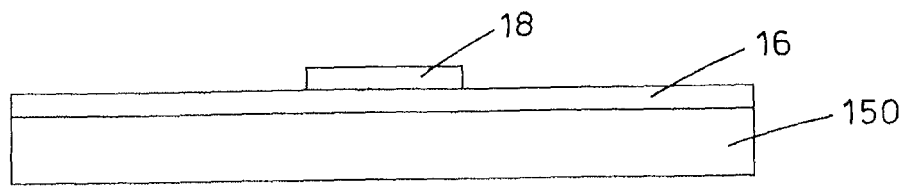
FIGS. 8A-8D are schematic views of working steps in an operating sequence to make the print in FIGS. 6 and 7.
Figure 8:
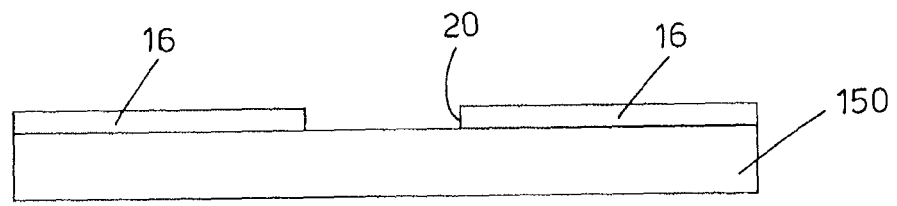
Figure 8C:
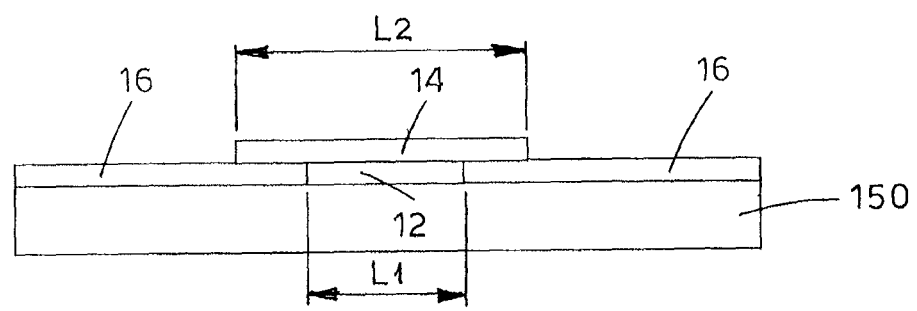
Figure 8D:
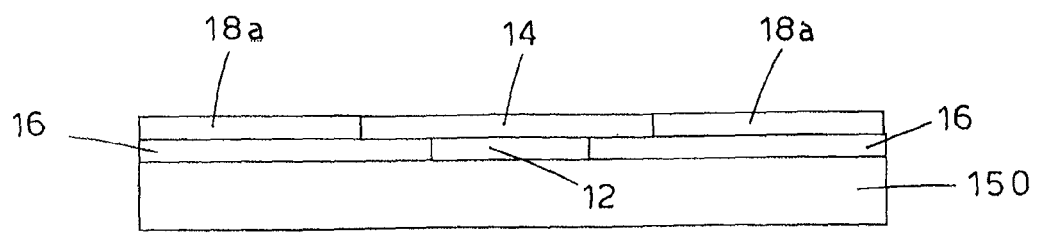
Figure 9:
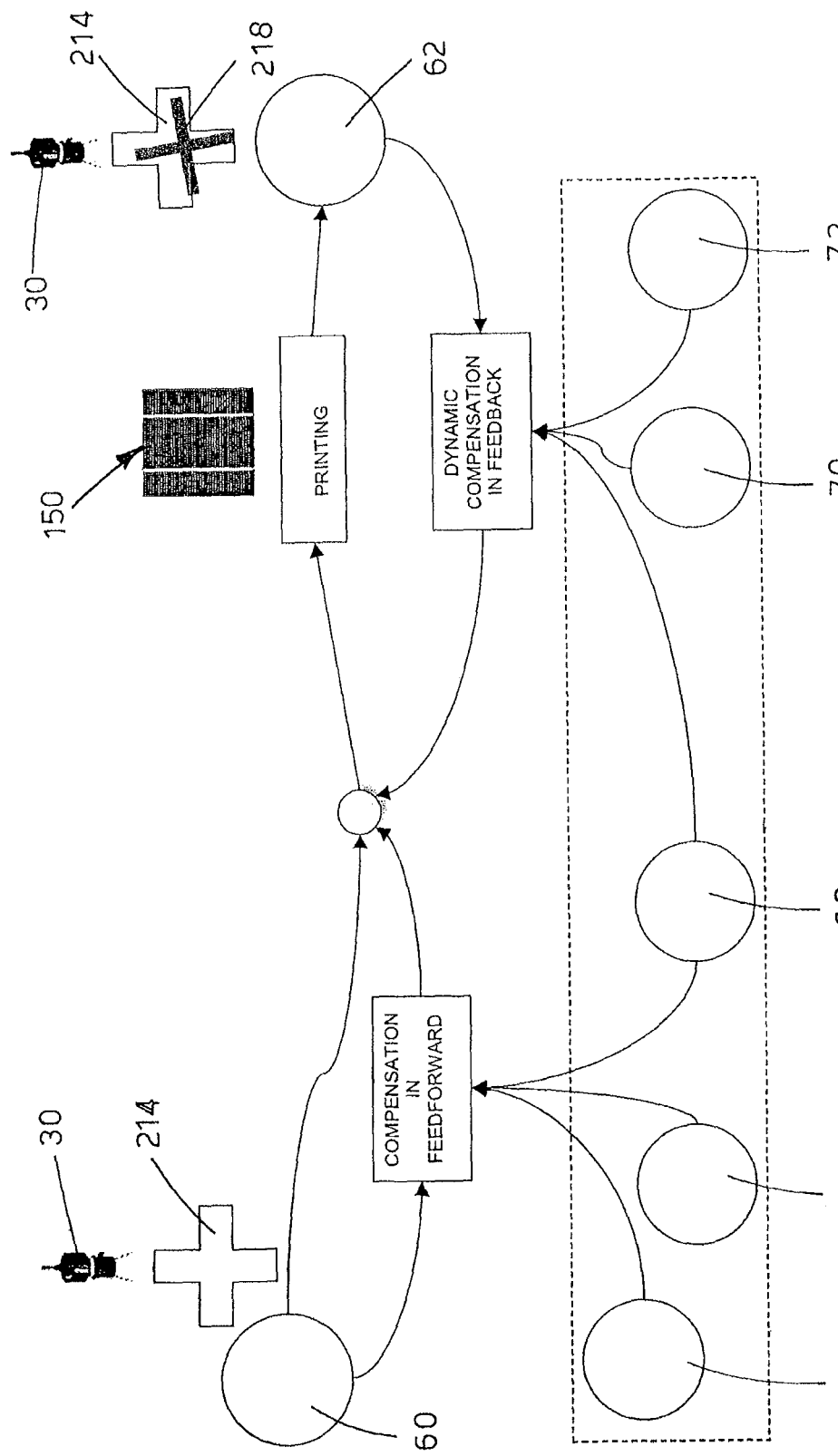
FIG. 9 is schematic diagram showing a control method for printing a pattern according to the present invention.

FIGS. 6 and 7 show a different form of embodiment of a multi-layer print to make conductive lines, in which a first metal layer 12, having a width L1 is printed on a substrate 150, as previously described, and on which a second metal layer 26 is subsequently deposited having a width L2 greater than the width L1. In one embodiment, the width L1 is comprised in the range of 30 µm 150 µm. In this way it is possible to define a shadow portion 32 on the substrate 150 having inclined shadow profiles, and therefore narrower with respect to that which would be obtained by printing overlapping layers having the same width. In this way it is possible to increase the actual portion of substrate interested by solar energy conversion, thus increasing the overall performance of the solar cell.

With reference to FIGS. 8A-8D, in which the method to obtain the multi-layer print of FIGS. 6 and 7 is shown, in a first printing step (FIG. 8A) on a substrate 150 of semi-conductor material provided with an insulating lining or layer 16, for example made of suitable oxides or nitrides or a layer of sacrificial silicon, a layer of incision paste 18 is deposited according to a predetermined and desired print profile so as to define the width L1 of the first layer 12.

In a subsequent step (FIG. 8B), the incision paste, left to act for a desired time, effects an action of removing/eroding a corresponding portion of insulating layer 16, so as to define a printing seating 20 conformed according to the print of the incision paste 18.

It is understood that, similarly to what has already been described, after the incision step, one or more cleaning steps can be carried out, in the known way, for example by means of known dry or wet cleaning processes, so as to remove possible impurities or residues of material from the printing seating 20.

In one embodiment the clean process may be performed by wetting surfaces of the substrate 150 with a cleaning solution. In one embodiment, the clean process may be performed by wetting the substrate with a cleaning solution, such as an SC1 cleaning solution, an SC2 cleaning solution, HF-last type cleaning solution, ozonated water solution, hydrofluoric acid (HF) and hydrogen peroxide (H2O2) solution, or other suitable and cost effective cleaning process.

In a second and third printing step, subsequent with respect to each other (FIG. 8C), the first metal layer 12 is deposited, according to the same print profile as in the first printing step, so as to deposit the layer 12 in said seating 20, according to the same print profile with width L1, and the second metal layer 14 deposited partially on top of the first layer 12 and having width L2.

It is understood that after each third and fourth printing step, one or more heating steps can be carried out, in a known way and not described here, able to solidify and/or stabilize the layers 12, 14.

In a fourth printing step (FIG. 8D) a second layer of incision paste 18a is deposited, according to a print profile substantially complementary to the print profile with which the second layer of metal material 14 was made.

In a subsequent step, the incision paste 18a, as already previously described, left to act for a desired time, effects an action of removing/eroding all the portion of the insulating layer 16, so as to achieve the configuration of the final print as in FIGS. 6 and 7.

Therefore, as well as optimizing the conductive lines deposited by subsequent printing steps of layers made with different materials, each chosen depending on the substrate 150 or of the layer immediately below, it is also possible to make layers according to substantially different print profiles, so as to increase the overall performance of the solar cells thus made, decreasing substantially the shadow portion 32.

Figure 10:
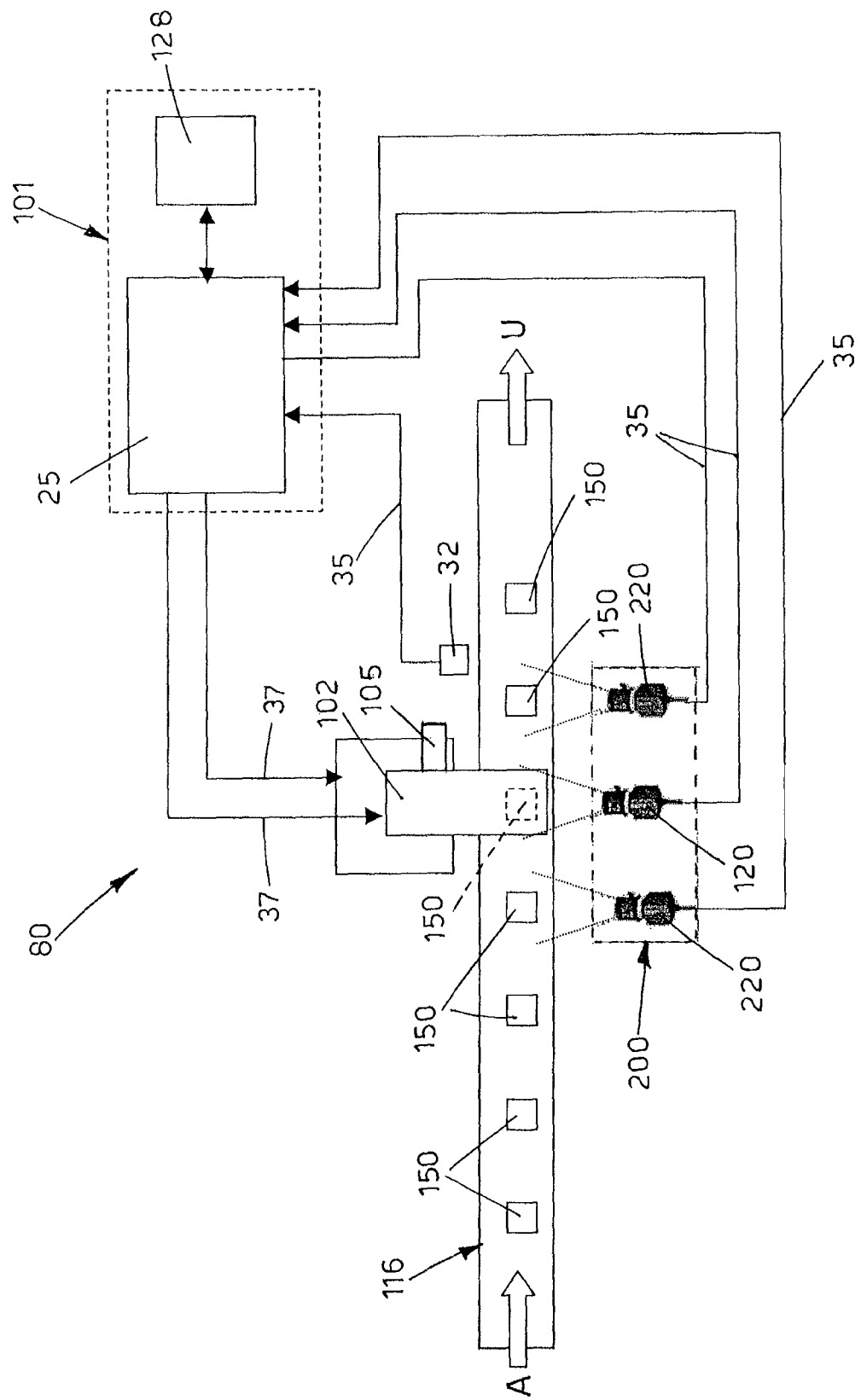
FIG. 10 is a schematic view from above of a control apparatus according to the present invention.

FIG. 10 is a schematic view of a control apparatus 80, in which the system 100 is not referred to and is only schematically and partially illustrated so as to describe the major components.

The control apparatus 80 comprises at least a processing head, in the case a printing head 102, located in a printing station, the system controller 101, or control unit, provided with the processing sub-unit 25 and the memory 128, one or more alignment actuators 105 associated with the printing head 102 or with a substrate 150 being worked, detection means 120, 220 such as, for example, one or more image or optical sensors or camera, at least a temperature sensor 32 and at least a humidity sensor 33.

Advantageously the substrates 150 are conveyed toward the printing station in a known manner, for example by means of a conveyor belt 116 in the direction indicated by the arrow "A" (FIGS. 1B and 10). The substrates 150 arrive from working steps upstream of the apparatus 80. The substrates 150 are also discharged, at the end of the silk-screen printing, again by means of the same belt 116 in the direction indicated by the arrow "U" (FIG. 10), or other known conveyor means, toward other working steps carried out downstream, such as for example a functional testing step of each substrate 150.

The method shown comprises work cycles each having one or more printing steps, in which, by means of the printing head 102, an equal number of layers of material are disposed on a substrate 150 in a predetermined pattern. In one example, the printing step includes urging a print material through a predetermined print pattern formed in a net found in the printing head 102, which is commonly referred to as a silk screen printing process.

The print material deposited on the substrate 150 can be a layer of conductive material, a layer of insulating material, or a layer of doping material, or other.

The printing steps are repeated until a desired pattern is obtained, whose chemical and physical properties, obtained as a sum or in any case superposition of the physical and chemical characteristics of each layer, achieve peculiar properties, for example, able to define a desired conductivity according to the level of the electric current.

Furthermore, in each printing step, the printing head 102 is regulated using configuration parameters that allow to obtain the desired result, for example in terms of thickness, homogeneity, definition or quality of the printed layer. Regulation parameters used to configure the printing head 102 in each printing step may comprise, for example, parameters related to pressure of a blade, not shown, of the printing head 102 or parameters related to the specific type of print material to be printed.

The method comprises a plurality of alignment steps, each provided respectively upstream of a corresponding printing step. In each of the alignment steps, by means of the alignment actuators 105, the substrate 150 being worked and the printing head 102 are reciprocally aligned so as to print the corresponding layer in a desired position, for example in a predetermined position of the surface of the substrate 150, or above the layer previously printed.

The method comprises a plurality of detection steps, as it will be described after in detail, in which by means of detection means data are acquired relating to the substrates 150 and the corresponding printing steps.

In this case, the method provides an acquisition step before printing 60 of a layer onto the substrate 150 being worked, in which, by means of the image sensor, or camera 120, positioned in correspondence with the printing head 102, at least an image is acquired of the substrate 150 or of a specific portion thereof in correspondence with a printing zone provided 214. The image is transmitted, in an appropriate format, by means of acquisition lines 35 to the system controller, or control unit 101.

The method provides to acquire a series of parameters which describe the behavior of the printing head 102 during printing, such as ambient pressure or temperature, pressure or force applied on specific components of the printing head 102, conditions of the pneumatic system if present, etc.

For example a force sensor, of the known type, is attached to the actuator that moves the screen printing blade. The force sensor is connected to the system controller 101 so as it is able to detect during, every print step, the actual force carried out by the actuator and compare it, in a subsequent step, with the actuation force set by the system controller itself for driving said actuator. In another example one or more pressure sensors are disposed in different position of the pneumatic circuit or system so as to detect the actual pressure in different points of the pneumatic system and successively compare it with the operative pressure set by the system controller 101.

The method also provides an acquisition step, after printing 62 of a corresponding layer onto the substrate 150 being worked, in which by means of the image sensor, or camera 120, at least an image is acquired of the substrate 150 or a specific portion thereof in correspondence with the printing zone provided 214 and an actual printing area 218. The image is transmitted, in an appropriate format, for example consistent with the image previously acquired, to the control unit 101.

The method comprises a plurality of memorization and comparison steps in which the data acquired in each detection step and transmitted to the system controller, or control unit 101, are continuously memorized in the memory 128 to generate a data base. Moreover, by means of the processing sub-unit 25, the data relating to a substrate 150 being worked are continuously compared with the data relating to substrates being worked or previously worked and already memorized in the memory 128.

The software found in the processing sub-unit 25 is used to compare the received data with the data already memorized in the memory 128, so as to allow the detection of errors or discrepancies and to logically carry out possible corrective actions both on the substrates being worked and also on the substrates still to be treated. In fact, according to the continuous comparison between the data memorized in the memory 128 and those continuously detected, the system controller 101 commands, by means of actuation lines 37, the alignment actuators 105 to correct the reciprocal alignment between the printing head 102 and the substrate 150 being worked so as to compensate the errors or discrepancies detected, and to calibrate the functioning parameters of the printing head 102 so as to correct the discrepancies between the desired working and the one obtained.

The control unit 101 therefore supervises and commands the positioning of the substrates and/or the printing of the layers of material in each corresponding step, both in feedback, therefore acting on the substrates being worked, and also in feedforward, acting on the substrates that will be worked afterward.

Therefore, the continuous acquisition of data, the memorization thereof and the continuous comparison with those previously acquired allows to create a data base which stores extensive records. In this way the analysis using stored data for previously processed substrates 150 can be used to increasingly improve the accuracy of the process, which allows to acquire a set of information from its own operating experience and to continually improve the print quality.

For example, the expected position of a print layer and the position actually detected are compared, and the difference is used to correct the position of the subsequent print. The process is applied to every cycle, thus obtaining a printing accuracy that improves from print to print, and which adapts—without intervention from the operator—to possible drifts, for example due to the deterioration of one or more components that make up the printing head 102, or due to the heat dilation of the substrate 150 and/or the support plane of the substrate 150.

In another example, the pressure set on the blade, not shown, of a silk-screen printing process in the printing head 102 is continuously compared with the pressure detected by one or more sensors incorporated in the net contacting component of the blade itself. The difference between the value set and the value detected is memorized and used to compensate the force delivered by the actuator(s) used to control the movement of the blade in the printing head 102.

In another example, the characteristics of the pattern printed by means of a silk-screen printing unit can depend on different parameters, such as the specific type of silk-screen printing paste, for example a conductive or a dielectric or a dopant paste or ink, and the specific net used, for example in function of its constitutive material, or the number of printing cycles to which the print is subjected.

It is therefore possible, by means of the method according to the present invention, to adapt the print parameters dynamically, according to the number of operating cycles to which the apparatus 80 and/or some of its specific parts have been subjected, such as the consumable components, for example the silk-screen printing net, according to the type of net, since different nets age in different ways—elasticity changes in function of the specific material—and/or depending on the silk-screen printing paste used.

It is therefore possible to align the printing head 102, reciprocally and substantially automatically from the very first print, for example for a new batch of substrates, with the substrate 150 being worked thus preventing or at least minimizing possible manual operations of initial set-up and/or setting both of the alignment actuators 105 and also of the printing head 102 and/or other components or equipment, preventing unwanted and prolonged downtimes of the machine. This is possible using data already stored in previous working cycles or pre-loaded from a batch file.

The method provides a plurality of detection steps, substantially continuous, to detect the temperature or humidity 64 or other ambient parameters. In fact, the apparatus 80 provides at least a group of temperature and/or humidity sensors 32, disposed in proximity with the printing head 102. The group of temperature and/or humidity sensors 32 may comprise integrated humidity and temperature sensor of the digital type, able to operate, for example in the full industrial range. Temperature sensor may eventually comprise simpler electric devices, as for example PTC o NTC resistor, electrically connected to an ADC (Analog to Digital Converter) input of the processing subunit 25.

The group of sensors 32 transmits the temperature and humidity values acquired to the control unit 101, by means of a corresponding detection line 35. The values are also continuously memorized in the memory 128 and compared, in the memorization and comparison steps, with the data already memorized in the data base. This allows to detect significant discrepancies and hence to detect and/or foresee possible phenomena of heat drift, by effecting the appropriate corrective actions or compensation both in feedback and in feedforward. The appropriate corrective actions are carried out both following the logic provided by the software in the system controller 101, in function of the stored data and its comparison with the actual detected data, and/or the intelligence provided to the system controller 101 to implement different corrective actions in function of actual data collected during the processing steps.

It also comes within the spirit of the present invention to provide data setting steps 66, for example the memorization of specific working sequences memorized in predetermined batch files, or automatic dynamic calibration steps 68 or, if necessary, manual dynamic calibration steps carried out as necessary, for example by an operator and memorized in the memory 128 to be effected every time there is a specific need according to the memorized previous experience.

In the particular case of a silk-screen printing machine, it is also in the spirit of the invention to provide that the detection steps comprise the detection of possible drifts of the net of the printing had 102 and/or the detection of mechanical drifts 72, made for example by means of the direct detection by image sensors 220 before and after printing, or even by means of indirect detection of the ambient parameters, such as the ambient temperature and/or humidity detected by the group of temperature and/or humidity sensors 32. For example, knowing the temperature/humidity variation curve of the constitutive material of the net, it is possible to foresee its mechanical drifts so as to compensate them regulating the delivered force of the actuators of the net.

It also comes within the spirit of the invention to provide that the detection steps also comprise the detection, direct or indirect, of the type of substrate 150 being worked, for example by means of the image sensors 220 or other type of detection, for example RFID. In this way it is possible to detect, in a substantially automatic manner, the type and/or batch of the substrates being worked, allowing to set almost automatically the printing head 102 according to the information already memorized. RFID information may include specific size and kind of the substrate being worked, or the specific substrate material, that is the specific semiconductor material.

Figure 11:
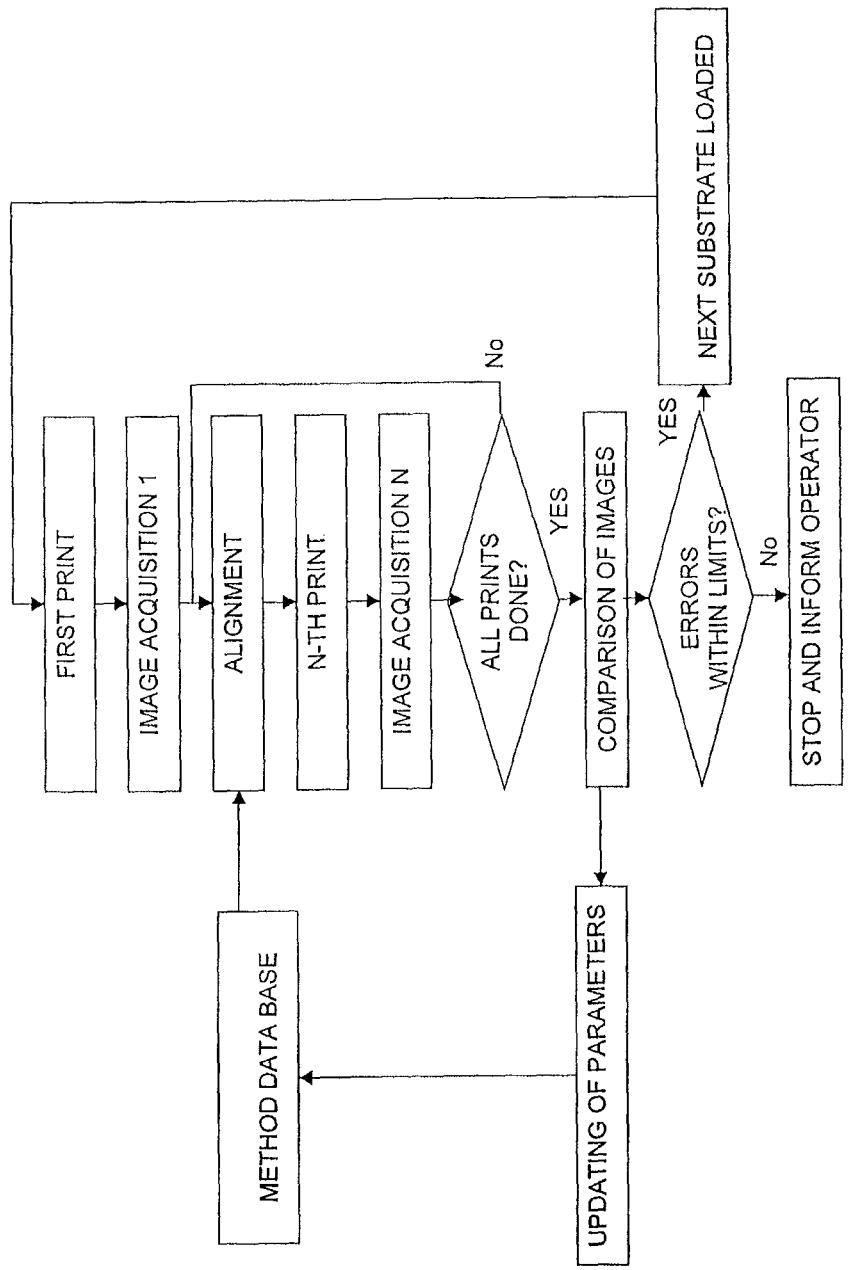
FIG. 11 is a flow chart showing the method to control the printing of a multi-layer pattern, according to the present invention.

FIG. 11 shows a flow chart showing the continuous sequence of the printing, detection, memorization and comparison steps, applied to the particular case of printing a multiple layer in which, in the event of anomalous errors or outside the desired or allowed limits, the machine is stopped and the error is signaled to an operator.

Double and multiple print of tracks (for example fingers and busbars) on a substrate 150 is particularly advantageous by using embodiments of the present invention. In fact, printing accuracy and repeatability of multiple tracks may be achieved with the control method according to the present invention.

Embodiments of the invention provide a solar cell formation process that includes, for example, the formation of metal contacts over heavily doped regions 241 that are formed in a desired pattern 230 on a surface 251 of a substrate 150.

Figure 12:
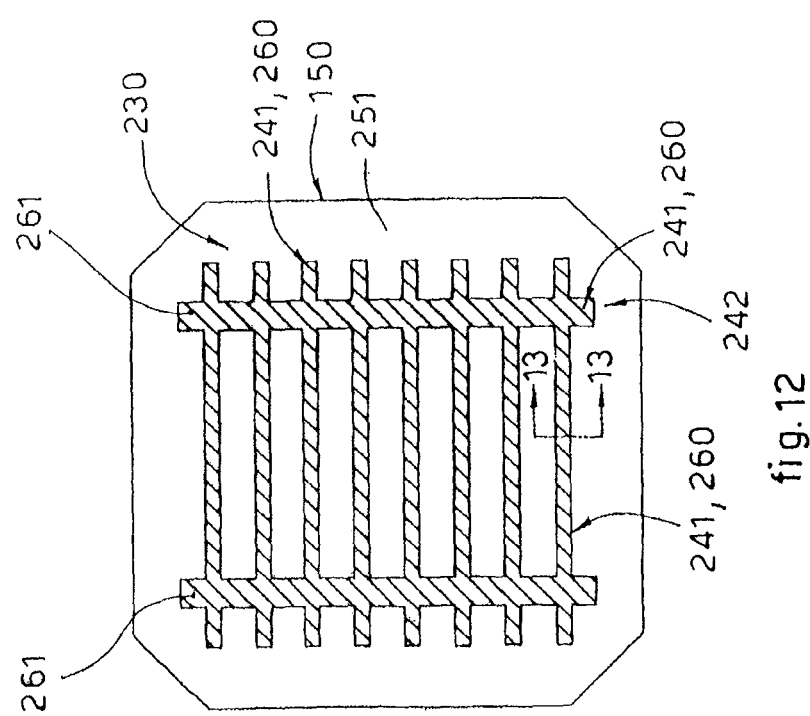
FIG. 12 is plan view of a surface of a substrate that has a heavily doped region and a patterned metal contact structure formed thereon according to one embodiment of the invention.

Embodiments of the invention provide that a dopant paste is printed to determine the heavily doped regions 241, a wide metal line defining wide fingers 260 is printed on the heavily doped regions 241, a narrow metal line defining narrow fingers 260*a* is printed on the wide metal line (see FIGS. 13A and 13B), and then busbars 261 are printed (FIG. 12).

FIG. 12 is plan view of a surface 251 of a substrate 150 that has a heavily doped region 241 and a patterned metal contact structure 242 formed thereon, such as fingers 260 and busbars 261.

Figure 13A:
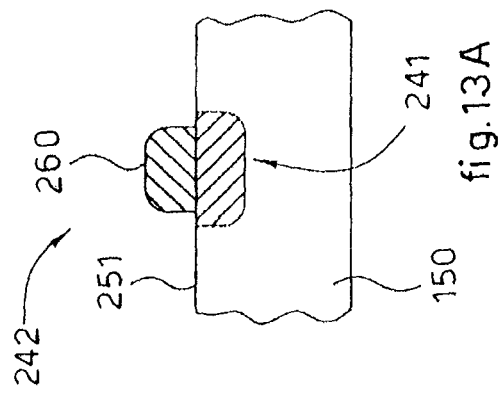
FIG. 13A is a close-up side cross-sectional view of a portion of the surface of the substrate shown in FIG. 12 according to one embodiment of the invention.

FIG. 13A is side cross-sectional view created at the cross-section line 13-13 shown in FIG. 12, and illustrates a portion of the surface 251 having a wide metal finger 260 disposed on the heavily doped region 241.

Figure 13B:
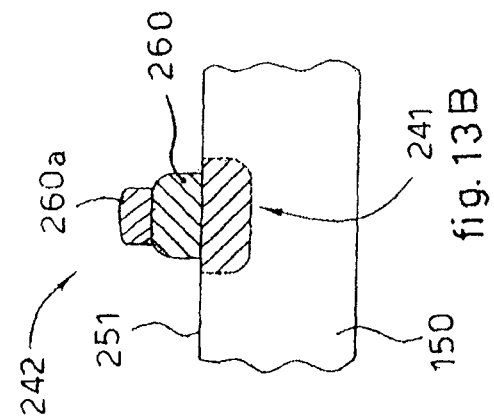
FIG. 13B is a close-up side cross-sectional view of a portion of the surface of the substrate shown in FIG. 12 according to a further embodiment of the invention.

FIG. 13B is side cross-sectional of a further embodiment and illustrates a portion of the surface 251 having a narrow metal finger 260*a* disposed on the wide metal finger 260.

The metal contact structure, such as fingers 260, 260*a* and busbars 261, are formed on the heavily doped regions 241 so that a high quality electrical connection can be formed between these two regions. Low-resistance, stable contacts are critical for the performance of the solar cell. The heavily doped regions 241 generally comprise a portion of the substrate 150 material that has about 0.1 atomic % or less of dopant atoms disposed therein. A patterned type of heavily doped regions 241 can be formed by conventional lithographic and ion implantation techniques, or conventional dielectric masking and high temperature furnace diffusion techniques that are well known in the art.

It is clear that modifications and/or additions of parts and/or steps may be made to the printing method and the control apparatus as described heretofore, without departing from the field and scope of the present invention.

For example it also comes within the spirit of the present invention to detect predetermined operating parameters connected to the printing head 102, such as for example the elasticity or other rheological properties of the net, the actual density of the material that is about to be deposited in a printing step.

It is also clear that, although the present invention has been described with reference to some specific examples, a person of skill in the art shall certainly be able to achieve many other equivalent forms of printing method for printing electronic devices and relative control apparatus, having the characteristics as set forth in the claims and hence all coming within the field of protection defined thereby.

The invention claimed is:

1. A method of printing a material on a surface of a substrate, comprising depositing a first print layer on the surface of the substrate using a first printing head of a printing apparatus, wherein the deposited first print layer forms a plurality of first print tracks in a first printing pattern on the surface of the substrate;

depositing a second print layer over at least a portion of a surface of the first print layer;

wherein the first print layer comprises a first print material comprising a conductive material and a vitrifiable frit material, and wherein the second print layer comprises a second print material comprising a conductive material;

detecting positions of the first print layer and the second print layer on the surface of the substrate using a detection device;

storing information on the detected positions of the first print layer and the second print layer within a control unit; and comparing the positions of the first print layer and the second print layer on the surface of the substrate using the control unit.

2. The method of claim 1, further comprising:

detecting the position of the first print tracks on the surface of the substrate using the detection device; and aligning the position of the substrate and the position of the printing head using an alignment device and information received from the detection device, prior to depositing the second print layer over the surface of the first print layer.

3. The method of claim 1, further comprising:

depositing an insulating layer over the surface of the substrate.

4. The method of claim 1, further comprising:

depositing an etching paste in a second printing pattern on at least a portion of the substrate.

5. The method of claim 4, wherein the etching paste comprises a material selected from the group consisting of an etchant, an incision paste, and combinations thereof.

6. The method of claim 4, wherein the etching paste comprises a doping paste, and the method further comprises:

diffusing the doping paste into a portion of the substrate to form a doped layer in the surface of the substrate.

7. The method of claim 1, further comprising:

cleaning the surface of the substrate to eliminate residue prior to the printing the first print layer and the second print layer.

8. The method of claim 1, further comprising:

adjusting the position of the substrate relative to a second printing head using information derived from the comparing the positions of the first print layer and the second print layer on the surface of the substrate.

9. The method of claim 1, further comprising:

correcting the position of the substrate relative to the printing head using a signal sent from the control unit.

10. The method of claim 1, further comprising:

adjusting the position of a second substrate before and after depositing a first and a second print layers on the second substrate using information derived from the comparing the positions of the first print layer and the second print layer on the surface of the substrate.

11. The method of claim 1, further comprising:

determining a reference position in the printing apparatus; and adjusting the position of the substrate relative to the reference position before and after depositing the first and the second print layers.

12. The method of claim 1, further comprising:

aligning the position of the substrate with respect to a printing work plane under the printing head.

13. The method of claim 1, further comprising:

acquiring temperature and humidity information of an environment disposed around the printing head, before or while the first print layer and the second print layer are deposited on the substrate.

14. The method of claim 13, further comprising:

adjusting the position of the substrate using the acquired temperature or humidity information.

\* \* \* \* \*